(12) United States Patent
Connah et al.

(10) Patent No.: US 6,465,875 B2
(45) Date of Patent: Oct. 15, 2002

(54) SEMICONDUCTOR DEVICE PACKAGE WITH PLURAL PAD LEAD FRAME

(75) Inventors: Glyn Connah, Glossop (GB); Peter R. Ewer, Oxted (GB)

(73) Assignee: International Rectifier Corporation, CA (US)

( * ) Notice: Subject to any disclaimer, the term of this patent is extended or adjusted under 35 U.S.C. 154(b) by 60 days.

(21) Appl. No.: 09/815,988

(22) Filed: Mar. 22, 2001

(65) Prior Publication Data

US 2001/0045627 A1 Nov. 29, 2001

Related U.S. Application Data

(60) Provisional application No. 60/192,379, filed on Mar. 27, 2000.

(51) Int. Cl.[7] .............................................. H01L 23/495
(52) U.S. Cl. ..................... 257/666; 257/684; 257/692; 257/723; 438/123
(58) Field of Search ................................. 257/502, 666, 257/578, 692, 684, 712, 713, 723, 724; 438/107, 109, 110, 123

(56) References Cited

U.S. PATENT DOCUMENTS

| | | | | |
|---|---|---|---|---|
| 5,313,095 A | * | 5/1994 | Tagawa et al. | 257/672 |
| 5,625,235 A | * | 4/1997 | Takiar | 257/776 |
| 5,767,573 A | * | 6/1998 | Noda et al. | 257/675 |
| 5,998,856 A | * | 12/1999 | Noda et al. | 257/666 |
| 6,153,926 A | * | 11/2000 | Kawamoto | 257/676 |
| 6,184,585 B1 | * | 2/2001 | Martinez et al. | 257/777 |

* cited by examiner

Primary Examiner—David Nelms
Assistant Examiner—Andy Huynh
(74) Attorney, Agent, or Firm—Ostrolenk, Faber, Gerb & Soffen, LLP

(57) ABSTRACT

A semiconductor device package has a lead frame with four or more die receiving pads. The first pad is large enough to receive two or more of the die, laterally spaced from one another, while the other pads receive at least one die each. The die may be arranged in a single straight path, or in spaced parallel paths. The tops of selected ones of the die are bonded to lead frame elements of adjacent pads to complete bridge type circuits within the package. The die and pads are enclosed by a molded plastic housing and short sections of the pads protrude through the housing wall.

10 Claims, 3 Drawing Sheets

SEMICONDUCTOR DEVICE PACKAGE WITH PLURAL PAD LEAD FRAME

RELATED APPLICATIONS

This application is related to and claims priority to Provisional Application Ser. No. 60/192,379 filed Mar. 27, 2000.

FIELD OF THE INVENTION

The invention relates to semiconductor device packages and more specifically relates to a novel package for housing plural interconnected die mounted on split pads of a common lead frame.

BACKGROUND OF THE INVENTION

This invention is an improvement of a structure disclosed in U.S. Pat. No. 5,977,630 in the names of Woodworth, Pearson and Ewer, and assigned to the assignee of the present invention. In that patent a split pad structure is described which permits the mounting and interconnection of die which are internally connected to define particular circuits. It would be desirable to enable the interconnection of three or more discrete die in the package but this was not feasible with the structure of the above U.S. Pat. No. 5,977,630.

BRIEF DESCRIPTION OF THE INVENTION

In accordance with the invention it was found that a single lead frame with at least three insulated pads enables the effective mounting and interconnection of four or more die, creating such circuits as single phase full wave bridges and the like. The first pad is large enough to receive two or more of the die, laterally spaced from one another, while the other pads receive at least one die each. The die may be arranged in a single straight path, or in spaced parallel paths. The tops of selected ones of the die are bonded to lead frame elements of adjacent pads to complete bridge type circuits within the package. The die and pads are enclosed by a molded plastic housing and short sections of the pads protrude through the housing wall.

DETAILED DESCRIPTION OF THE DRAWINGS

Figure 2:
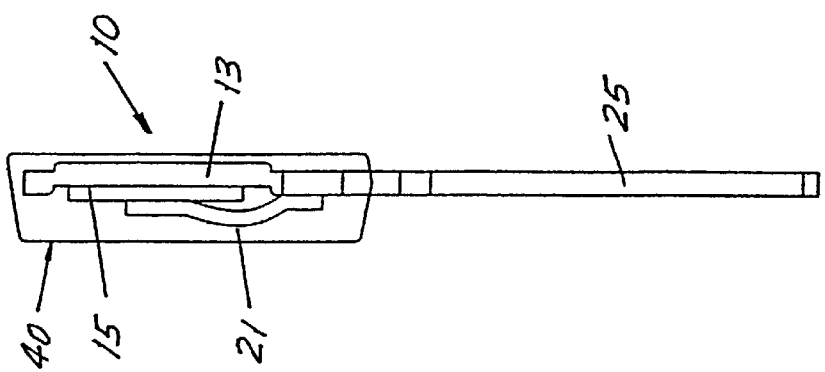
FIG. 2 is a side view of FIG. 1.
Figure 1:
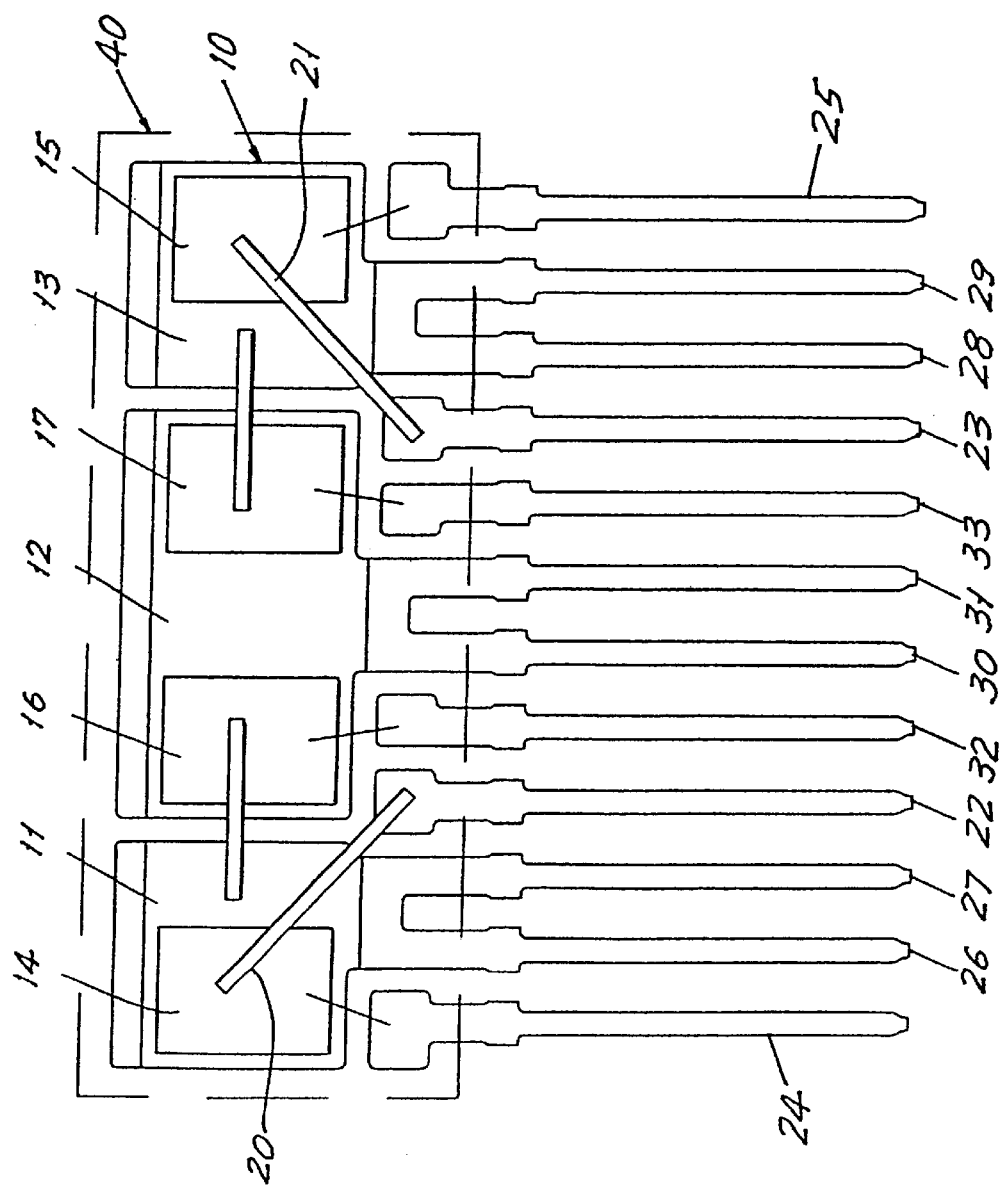
FIG. 1 is a top view of a lead frame with three pads which receives four power MOSFET die in a single phase half wave circuit configuration.

Referring first to FIGS. 1 and 2, the lead frame 10 shown therein is of the general type shown in U.S. Pat. No. 5,977,630, the disclosure of which is incorporated herein, except that the lead frame of these Figures has three pads 11, 12 and 13 which are severable from one another. Further, four or more die 14 to 17 are carried on the pads. Die 14 and 15 may be power MOSgated devices which are vertically conductive from a top source (or emitter) contact to bottom drain (or collector contact). a gate terminal is also formed on the upper surface. Die 14 and 15 have their drain metalization soldered or adhesively connected to the surfaces of pads 11 and 13 respectively. MOSFET die 16 and 17 are both secured, drain side down to conductive pad 12, and their drains are connected together by pad 12.

While die 14 to 17 are described as MOSFETs they may be other kinds of die such as diodes, IGBTs, power integrated circuits, and the like, or mixtures of such devices as required by the circuit to be defined.

The source electrodes of die 14 and 15 are connected by wirebonds 20 and 21 to lead frame pins 22 and 23 respectively and their gates are connected to pins 24 and 25 respectively. The drains of die 14 and 15 are connected to pins 26–27 and 28–29 respectively which are integral extensions of pads 11 and 13 respectively. Note that all die are laid out along a straight path for ease of automated assembly.

The drains of die 16 and 17 are connected to pins 30–31 which are integral extensions of pad 12 and their gates are connected to pins 32 and 33 respectively.

Finally, the sources of die 16 and 17 are wire bonded to adjacent open areas of pads 11 and 13 respectively, thus completing a bridge connected circuit.

Thereafter, the structure of FIGS. 1 and 2 is over molded by a suitable plastic insulation mold 40, shown in dashed lines in FIG. 1.

Figure 5:
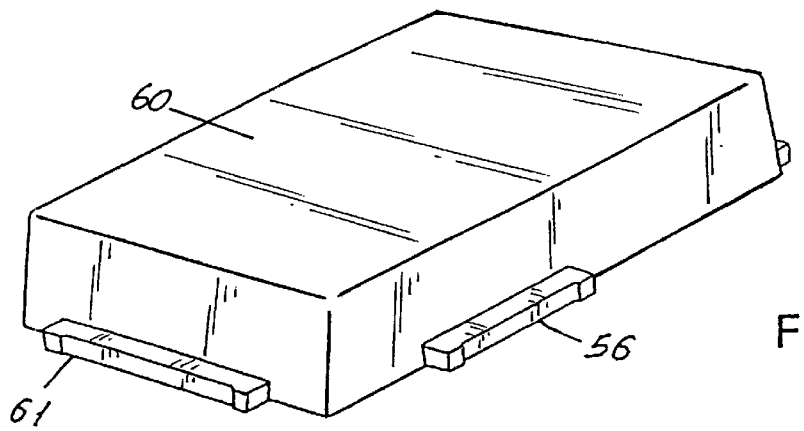
FIG. 5 is an isometric view of a housing which can contain the lead frames and die of FIGS. 3 and 4.
Figure 3:
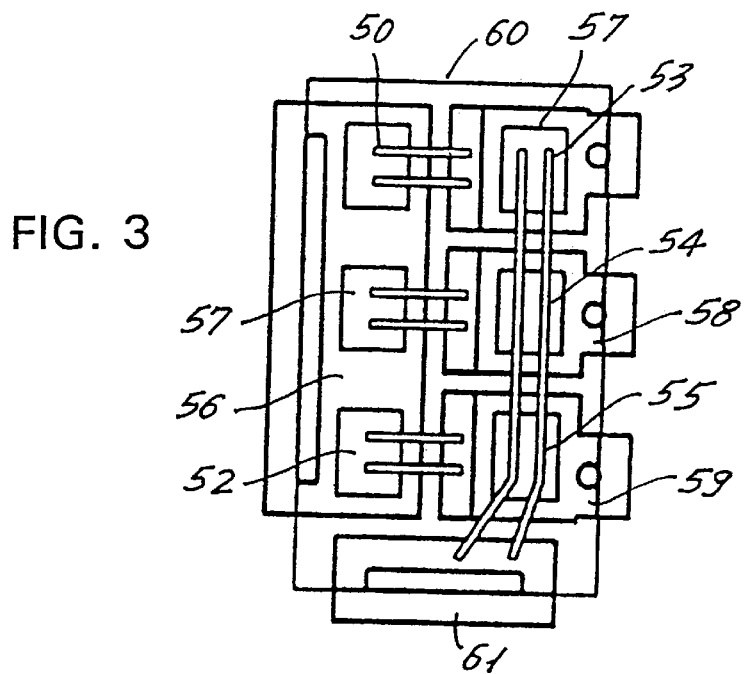
FIG. 3 is a view like that of FIG. 1 of a second embodiment of the invention, using four pads to receive six power semiconductor die connected in a 3-phase bridge arrangement.

The embodiment of FIG. 3 shows a three phase bridge connected circuit using six die 50 to 55 which may be or MOSFETs, IGBTs, diodes and mixtures of such devices. Die 50, 51 and 52 are mounted on a single pad 56 while die 53, 54 and 55 are mounted on respective split pads 57, 58 and 59. Note that die 50, 51, 52 and die 53, 54, 55 lie in respective spaced straight parallel paths. The die are then suitable wire bonded together and then overmolded by housing 60 (FIG. 5). Note that pad 56 extends through the side of the housing 60, as does a pad 61 which receives the top contacts of die 53, 54 and 55. Extensions of pads 57, 58 and 59 extend through the rear side of housing 60 (not shown in FIG. 5). Further, the bottom surfaces of pads 56, 57, 58 and 59 can be flush with the bottom of housing 60 so as to be capable of surface mounting.

Figure 4:
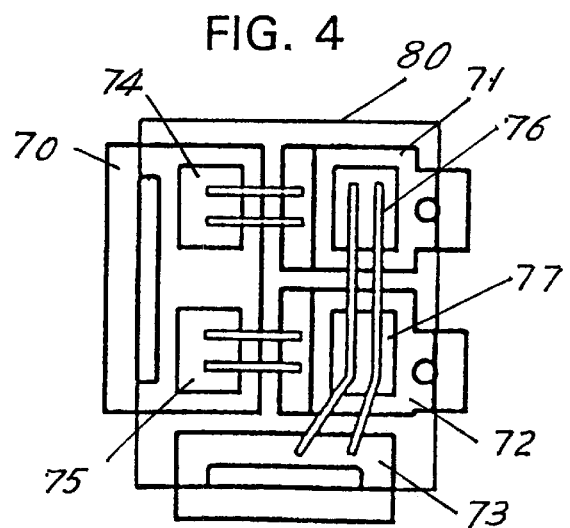
FIG. 4 shows a still further embodiment of the invention for a single phase full wave bridge circuit.
Figure 6:
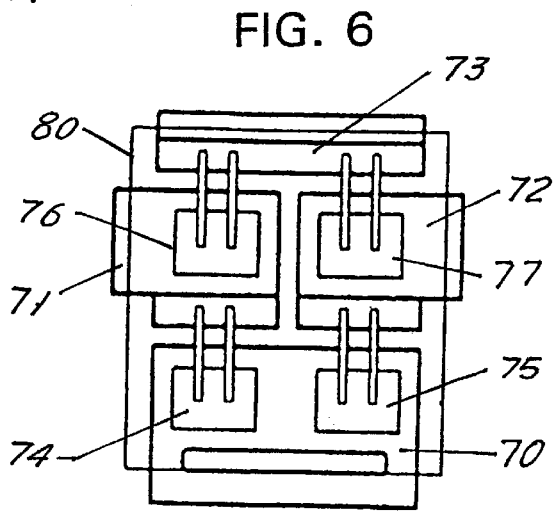
FIG. 6 is a further embodiment for the bridge of FIG. 4.

The packages of FIGS. 4 and 6 are provided with 4 lead frame pads 70, 71, 72 and 73 with two die 74 and 75 having their bottom electrodes soldered or otherwise fixed to lead frame section 70; and die 76 and 77 having their bottom electrodes fixed to pads 71 and 72 respectively. The top electrodes of each of die 74 to 77 are wire bonded to adjacent lead frames by short straight low inductance path wire bonds. The plastic housing 80 overmolds the lead frames and die.

Figure 7:
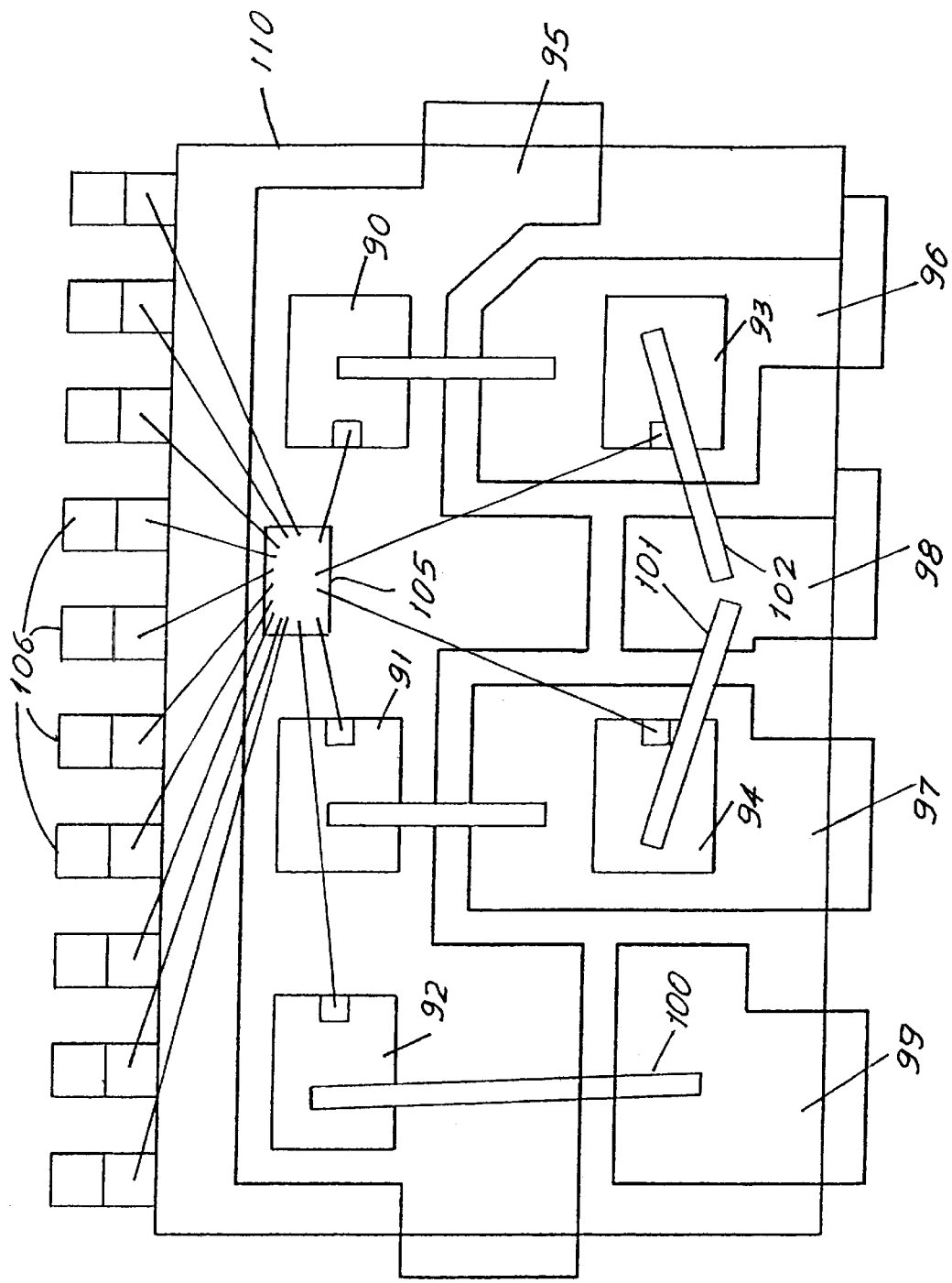
FIG. 7 is an embodiment of the invention using three pads for five die.

FIG. 7 is an embodiment of the invention in which five die 90 to 94 are mounted on three pads and are interconnected by wire bonding and through the pads. Two additional pads 98 and 99 which receive certain wire bonds (100, 101, 102) are also provided. A control IC die 105 is mounted on pad 95 and has input control pins 106 suitably connected thereto. The outputs of IC 105 are wire bonded to the gates of die 90 to 94. A housing 110 overmolds the full assembly and segments of pads 95 to 99 extend beyond the housing edge. The die shown in FIG. 7 are typically power MOSFETs available from International Rectifier Corporation and having any desired size, typically the size HEX2.5.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device package comprising at least three coplanar conductive lead frame pads having upper and lower surfaces and insulated from one another; at least first and second semiconductor die each having upper and lower surfaces and both having their said lower surface fixed to the upper surface of a first one of said conductive lead frame pads; and at least third and fourth additional die having upper and lower surfaces and having their lower surfaces fixed to the upper surface of said second and third pads of said at least three pads respectively; said upper surfaces of at least two of said die being wire bonded to one of said pads which is adjacent the pad to which they are respectively fixed; and an insulation housing enclosing said die and at least the upper portions of said pads.

2. The device of claim 1, wherein each of said pads has a portion thereof which protrudes through the surface of said housing.

3. The device of claim , wherein all of said pads and all of said die are all oriented along a straight path.

4. The device of claim 3, wherein said at least three coplanar pads consist of four pads; said one of said four pads having three die fixed thereto and oriented along a straight path; and a respective single die connected to each of the remaining three pads; said respective ones of said single die oriented along a straight path which is parallel to said straight path of said three die.

5. The device of claim 3, wherein said one of said pads has at least two spaced fixed thereto, and wherein each of the remaining pads and die are oriented along a path which is spaced from and parallel to the path between said two spaced die.

6. The device of claim 5, which further includes an integrated circuit control die mounted on said one of said pads and connected to each of said die for controlling the operation thereof.

7. The device of claim 3, wherein each of said pads has a portion thereof which protrudes through the surface of said housing.

8. The device of claim 4, wherein each of said pads has a portion thereof which protrudes through the surface of said housing.

9. The device of claim 5, wherein each of said pads has a portion thereof which protrudes through the surface of said housing.

10. The device of claim 6, wherein each of said pads has a portion thereof which protrudes through the surface of said housing.

* * * * *